United States Patent [19]

Weckler

[11] 4,100,513
[45] Jul. 11, 1978

[54] SEMICONDUCTOR FILTERING APPARATUS

[75] Inventor: Gene P. Weckler, Campbell, Calif.

[73] Assignee: Reticon Corporation, Sunnyvale, Calif.

[21] Appl. No.: 710,596

[22] Filed: Aug. 2, 1976

Related U.S. Application Data

[63] Continuation-in-part of Ser. No. 687,370, May 17, 1976, which is a continuation-in-part of Ser. No. 614,655, Sep. 18, 1975, abandoned.

[51] Int. Cl.² .................... H03H 7/10; H03H 7/28; H03H 7/30; H03K 5/159
[52] U.S. Cl. ........................ 333/70 T; 307/221 C; 307/221 D; 357/24; 364/862; 364/825
[58] Field of Search .................. 333/29, 28 R, 70 T, 333/70 R; 307/221 R, 221 C, 221 D, 238; 357/24, 23, 54; 328/167; 235/181

[56] References Cited

U.S. PATENT DOCUMENTS

| 3,711,753 | 1/1973 | Brand et al. | 357/23 |
| 3,767,983 | 10/1973 | Berglund | 307/221 C |
| 3,809,923 | 5/1974 | Esser | 307/221 D |
| 3,825,945 | 7/1974 | Masuoka | 357/23 |
| 3,825,946 | 7/1974 | Frohman-Bentchkowski | 357/23 |
| 3,935,439 | 1/1976 | Buss et al. | 235/181 |
| 3,953,745 | 4/1976 | Bailey | 333/70 T X |
| 3,973,138 | 8/1976 | Puckette et al. | 307/221 D |
| 3,997,973 | 12/1976 | Buss | 333/70 T |

Primary Examiner—Eli Lieberman
Assistant Examiner—Marvin Nussbaum
Attorney, Agent, or Firm—Blakely, Sokoloff, Taylor & Zafman

[57] ABSTRACT

A semiconductor filtering apparatus substantially fabricated as a metal-oxide-semiconductor (MOS) integrated circuit that permits discrete time correlation or convolution of an analog input signal with a binary or analog correlating signal. The apparatus may also be employed as a recursive filter. A plurality of novel bucket-brigade charge transfer means are employed to shift the input analog signal past non-destructive read-out taps. Electrically programmable floating gate devices are used to store either a binary or analog correlating signal. The sum or difference signal associated with each of the plurality of charge transfer means is weighted to produce the final filter output in one embodiment.

13 Claims, 7 Drawing Figures

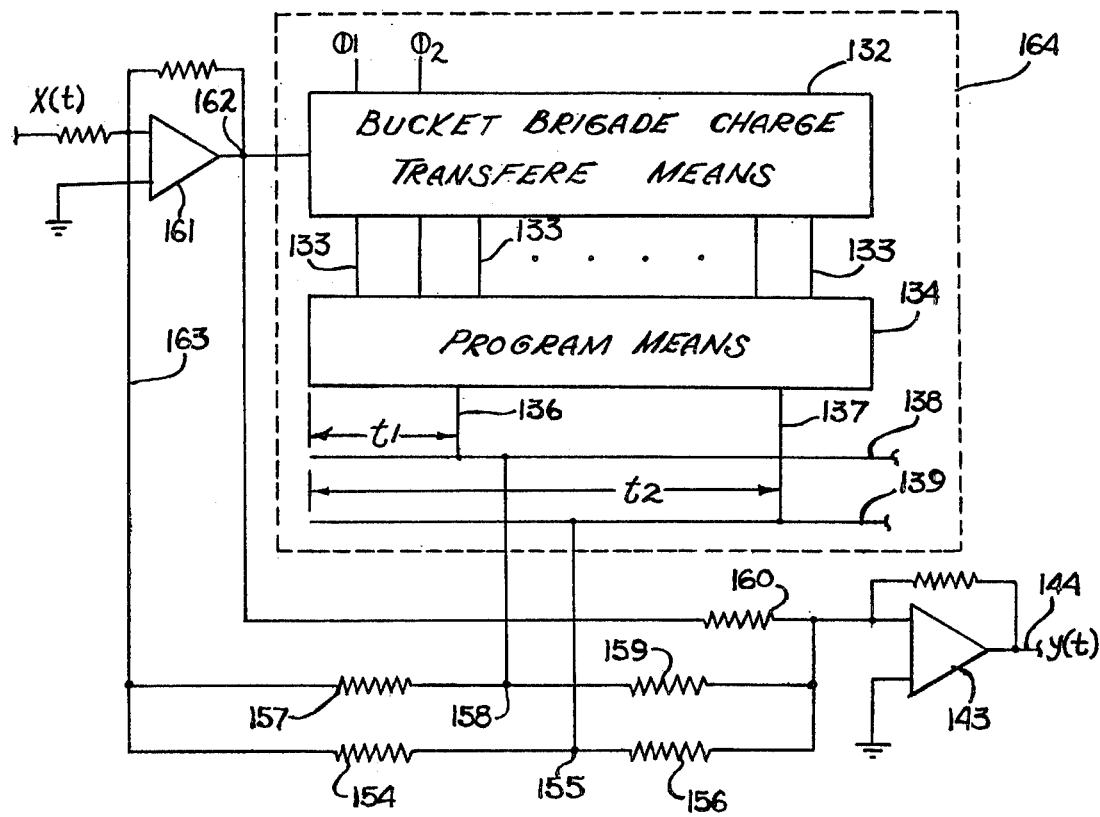
_Fig. 6_
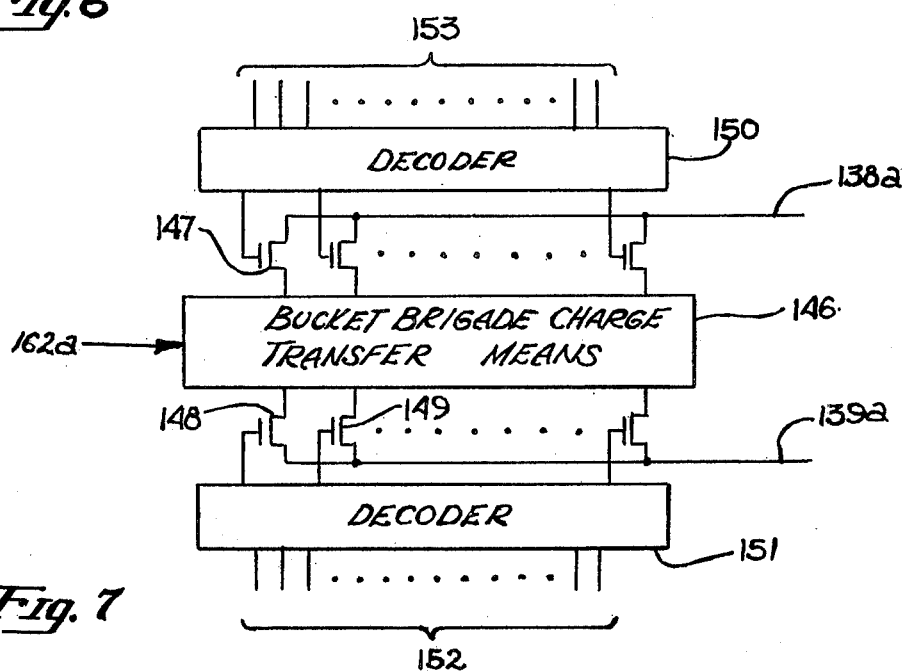
_Fig. 7_

SEMICONDUCTOR FILTERING APPARATUS

This is a continuation-in-part application of Application Ser. No. 687,370, filed on May 17, 1976; which application was a continuation-in-part of application Ser. No. 614,655, filed Sept. 18, 1975, and now abandoned.

BACKGROUND OF THE INVENTION

1. Field of the Invention

The invention relates to the field of semiconductor filters, correlating means and recursive filters particularly employing integrated circuits.

2. Prior Art

In general, there has been a recognition of the benefits of semiconductor (integrated circuit) transversal and recursive filters. Such filters permit easy correlations (or convolution) between signals, and permit computation of time-invariant linear transforms. Among some of the specific suggested applications for such filters are: (1) determination of complex linear chirps for performing the discrete Fourier or cosine transforms by the Chirp-Z-transform algorithm, (2) broadband phase shifting for single sideband systems, and (3) broadband differentiators and integrators for synthesizing sampled data control loops, in addition to countless other signal processing problems. See "Signal Processing Architectures Using Transversal Filter Technology", by Whitehouse, Means and Speiser (Naval Underwater Center), Sumposium on Circuits and Systems, 1975; and "The Serial Analog Processor" by Gene P. Weckler (Reticon Corporation), ISSCC 75, (Feb. 13, 1975).

Two general approaches have been employed for such filters or correlators. In one, an analog signal is stored while weighted taps are moved past the stored (static) signal. In the other approach, an analog signal is moved past fixed (weighted) taps. This latter approach permits real-time processing of an input signal.

In filters or correlators which employ a "moving" analog signal, most typically charge-coupled devices (CCD) or bucket-brigade devices (BBD), are used to transfer charge representing the input (analog signal). BBD may be realized as integrated circuits with both bipolar and MOS technology, and CCD may be realized with MOS technology. However, one major problem in obtaining a practical system has been the problem of providing a high impedance, weighted tap, to non-destructively sense the "moving" analog signal in a CCD or BBD register. The prior art solutions to this problem have, at best, one of the following shortcomings: (1) sensitive to normal semiconductor process variations such as oxide thicknesses, mask misalignment, etc. (2) require generation of special masks for each correlating function or signal, or (3) use expensive, non-integrated, discrete components. See "Bucket-Brigade Transversal Filter" by Puckette, Butler and Smith, *IEEE Transactions on Circuits and Systems,* Vol. CAS-21, No. 4, July 1974 (pages 502–510) for a discussion of "on chip" tap weights; also see "Transversal Filtering Using Charge-Transfer Devices": by Buss, Collins, Bailey and Reeves, *IEEE Journal of Solid-State Circuits,* Vol. Sc-8, No. 2, April, 1973 (pages 138–146). The techniques described in these articles include electrode weighting (split electrode) for CCD, weighted capacitors, and a transconductance technique.

Digital weighting of the outputs from a plurality of filters has been disclosed, see *Charge Transfer Devices* by Sequin and Tompett, published by Academic Press, Inc. (1975), Pages 230–231.

As will be seen, the present invention in its preferred embodiment, employs a novel bucket-brigade register for moving an input analog signal past taps which are easily (electrically) programmed either with a binary signal or with a analog signal. The summed or differenced output associated with each set of programmed taps is weighted, thereby permitting a highly resolved output signal in one embodiment to provide a transversal filter. For the most part, the filter is fabricated on a single MOS chip.

BRIEF DESCRIPTION OF THE DRAWINGS

FIG. 6 is a block diagram illustrating the filter of FIG. 3 employed as a recursive filter; and, FIG. 7 is a block diagram illustrating time varying filtering means employing a bucket-brigade charge transfer means.

SUMMARY OF THE INVENTION

A semiconductor filter is described which permits discrete time correlation or convolution of an analog input signal with a binary or analog correlating signal, and recursive filtering. The input analog signal is applied to a plurality of bucket-brigade charge transfer means or registers. In the presently preferred embodiment, each of the registers includes a plurality of stages for transferring charge representative of the input analog signal. The bucket-brigade register, in its presently preferred embodiment, is driven by a two phase clock signal, and employs intermediate holding stages. Nondestructive readout is provided at each tap along each register through use of a pair of field-effect transistors. These readout transistors couple each stage of the bucket-brigade register to either a first, or a second, readout line. In the presently preferred embodiment, an electrically programmable device is coupled in series with each readout transistors, thus the charge in the bucket-brigade register sensed by each readout transistor may be selectively coupled to the readout lines by programming these devices. Each device comprises a floating gate; charge is selectively injected onto the gates thereby altering the characteristics of the device. These devices may be operated as binary devices, that is, on or off, or may be programmed to pass a predetermined amount of signal. The charge placed on the floating gates may be removed by subjecting the devices to ultraviolet radiation.

The first and second readout lines associated with each of the bucket-brigade registers is coupled to a differential amplifier with the output of each differential amplifier being weighted and applied to a single output amplifier, in one embodiment. Thus, in this binary embodiment which employs eight parallel bucket-brigade registers, the correlating signal may have a range which varies from 0 to ± 256 (in increments of one) at each of the 64 taps disposed along the registers.

As presently fabricated, the bucket-brigade registers, readout transistors, programmable floating gate devices, and decoders used for programming such devices are fabricated on a single silicon substrate employing n-channel MOS technology and two layers of polycrystalline silicon disposed about the substrate.

DETAILED DESCRIPTION OF THE INVENTION

A semiconductor filter or correlator is disclosed which permits discrete time correlation or convolution of an analog input signal with a correlating signal and which may also be employed as a recursive filter. The correlating signal may be in binary form or in analog form. While an analog input signal is employed for purposes of discussion, it will also be appreciated that other types of input signals may be utilized.

Figure 1:
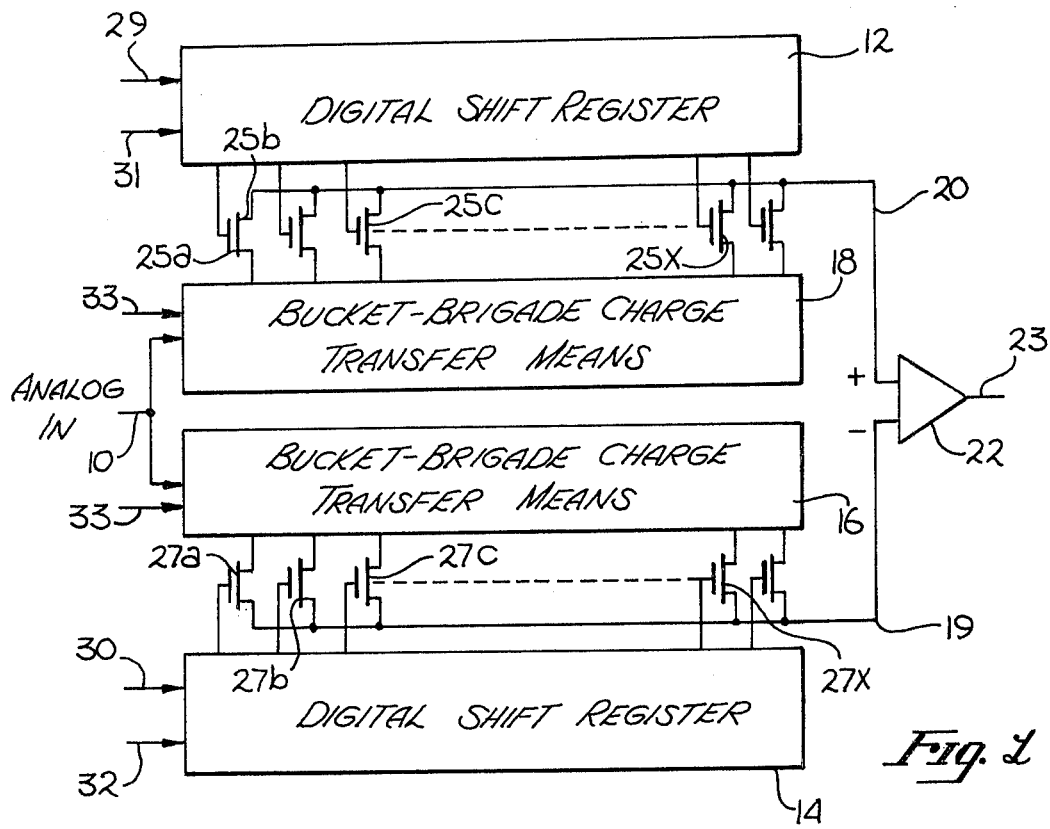
FIG. 1 is a block diagram illustrating one embodiment of the present invention wherein the taps of a bucket-brigade charge transfer means are programmed through the use of a shift register.

In FIG. 1, an embodiment of the invention is illustrated wherein a digital shift register such as a static shift register is used for purposes of programming the readout from taps of a bucket-brigade charge transfer means. Two digital shift registers 12 and 14 are illustrated. These registers may be ordinary shift registers. These digital shift registers 12 and 14 receive the correlating signal on lines 29 and 30, respectively. Lines 31 and 32 are shown to illustrate the input timing signals typically used for transferring the digital information along the registers 12 and 14. As presently implemented, the digital shift registers 12 and 14 are MOS, static shift registers.

Associated with each of the registers 12 and 14 is a bucket-brigade charge transfer means, such as means 18, which is coupled to register 12, and means 16, which is coupled to register 14. The bucket-brigade charge transfer means 16 and 18 receive the same input signal on line 10, and transfer this signal (in the form of charge) along the transfer means 16 and 18. Any one of a plurality of known bucket-brigade charge transfer means may be employed, however, a specific embodiment of a bucket-brigade charge transfer means shall be described, in detail, in conjunction with FIGS. 3, 4 and 5. Line 33 receives timing signals for purposes of transferring charge along the transfer means 16 and 18.

It is assumed for purposes of explanation for the embodiment of FIG. 1, that each of the transfer means 16 and 18 includes a plurality of taps at which charge transferred along these means may be non-destructively sensed. Each of these taps is coupled to one terminal of a field-effect transistor. Specifically referring to means 18, transistor 25a has one of its terminals coupled to a tap of transfer means 18 and the other of its terminals coupled to an output line 20. In a similar manner, the field-effect transistors 25b and 25c have one of their terminals coupled to taps of transfer means 18, and the other of their terminals coupled to the output line 20. Similarly, a field-effect transistor couples each of the taps of transfer means 18 and to the output line 20. The bucket-brigade charge transfer means 16 has each of its taps coupled to the output line 19 through a field-effect transistor, such as field-effect transistors 27a, 27b, and so forth.

The output line 20 is coupled to the positive input terminal of a differential amplifier 22, while the output line 19 is coupled to the negative input terminal of differential amplifier 22. The output of amplifier 22 is shown as line 23.

The gates of each of the transistors 25 is coupled to a stage of the digital shift register 12. It is assumed for purposes of explanation that if a binary one is stored within the first stage of the register 12, then a potential will be applied to the gate of the field-effect transistor 25a, causing that transistor to conduct; if a binary zero is contained within the second stage of the digital shift register 12, transistor 25b will not conduct. Similarly, the gates of the field-effect transistors 27 are coupled to the stages of the digital shift register 14.

The filter of FIG. 1 in its simplest form may be utilized as a variable length analog shift register. Assume for purposes of discussion that a single binary one is placed within register 12, while all other bits within the register are binary zeros. The input analog signal applied to line 10 may then be sensed with a time delay. This time delay is a function of the position of the binary one within register 12. It is apparent that a variable delay may be achieved by repositioning the binary one within register 12. Also, by adjusting the clock rates used to drive the register 12 and the transfer means 18, it is possible to shift the input frequency either to a higher or lower frequency, thus facilitating pitch control. For purposes of correlation, any desired bit pattern representing a correlating signal may be placed into registers 12 and 14, thereby activating the desired taps along the transfer means 16 and 18. The output signal on lines 19 and 20 will then be a function of this correlating signal. The signals on the output lines 19 and 20 represents the correlation of the input signal and correlating signal since the signals sensed at each of the taps for a given transfer means is summed on the respective output line 19 or 20. Note that since the output line 19 is coupled to the negative terminal of the differential amplifier 22, both a positive and negative correlating signal or other function may be employed.

Figure 2:
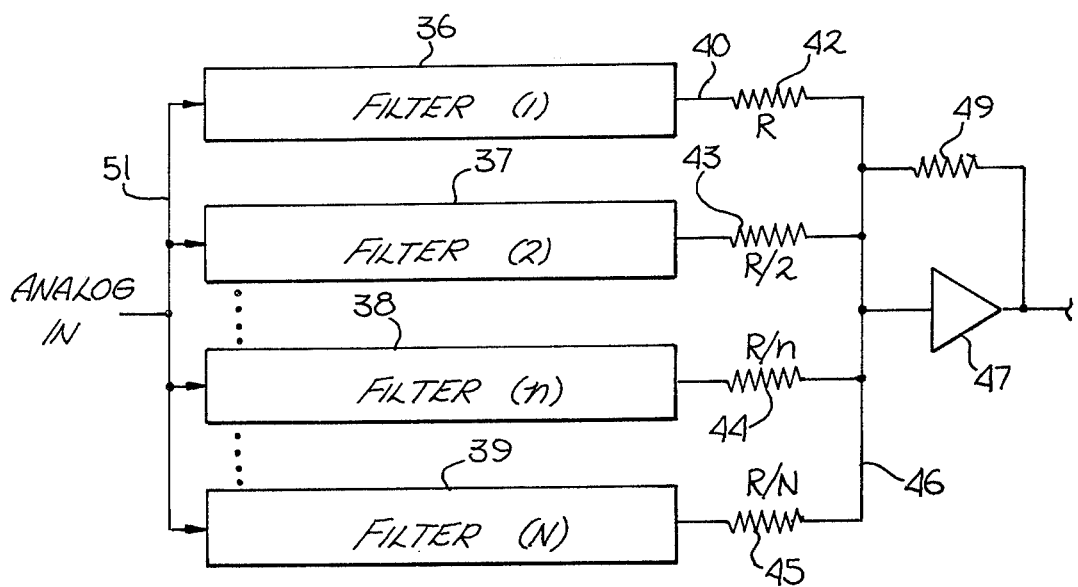
FIG. 2 is a block diagram illustrating the use of a plurality of filters where the output of these filters are weighted.

Referring now to FIG. 2, the filter of FIG. 1 is shown as filter 36; other filters such as the one shown in FIG. 1 are also shown as filters 37, 38 and 39. The output of the filter of FIG. 1 (line 23) is shown for filter 36 as line 40. The intput analog signal line, line 10 of FIG. 1, is shown as line 51 in FIG. 2; this line is coupled to each of the filters 37, 37, 38 and 39. The various timing signals, and other control lines shown in conjunction with FIG. 1, are not illustrated in FIG. 2 in order not to complicate FIG. 2. Each of the outputs from each of the filters of FIG. 2 is applied through a weighting resistor, such as resistors 42, 43, 44 and 45 to the input terminal (line 46) of an amplifier 47. A feedback resistor 49 is shown coupled from the output of amplifier 47 to the input of the amplifier. The output of each filter (after passing through its respective weighting resistor) is summed on line 46.

Through use of the resistors 42 through 45, the output of each of the filters may be weighted, thereby allowing the correlating signal to be accurately defined. For example, resistor 42 is shown as having a value R, while resistor 43 is shown as having a value R/2. The output from filter 38 is coupled to resistor 44 shown as having a value of R/n, while the remaining filter is coupled to line 46 through resistor 45 which resistor has a value of R/N. With the plurality of filters shown in FIG. 2, the correlating signal may be digitized with each sample or value of the correlating signal represented by N bits. The most significant bits of the correlating bits are stored within filter 39 and the least significant bits are stored in register 36. With this arrangement, the correlating signal may be defined with more accuracy by increasing the number (N) of filters. As will be seen, the use of a plurality of filters is utilized not only with the embodiment illustrated in FIG. 1, but also may be used with the embodiment to be described in conjunction with FIGS. 3, 4 and 5.

Figure 3:
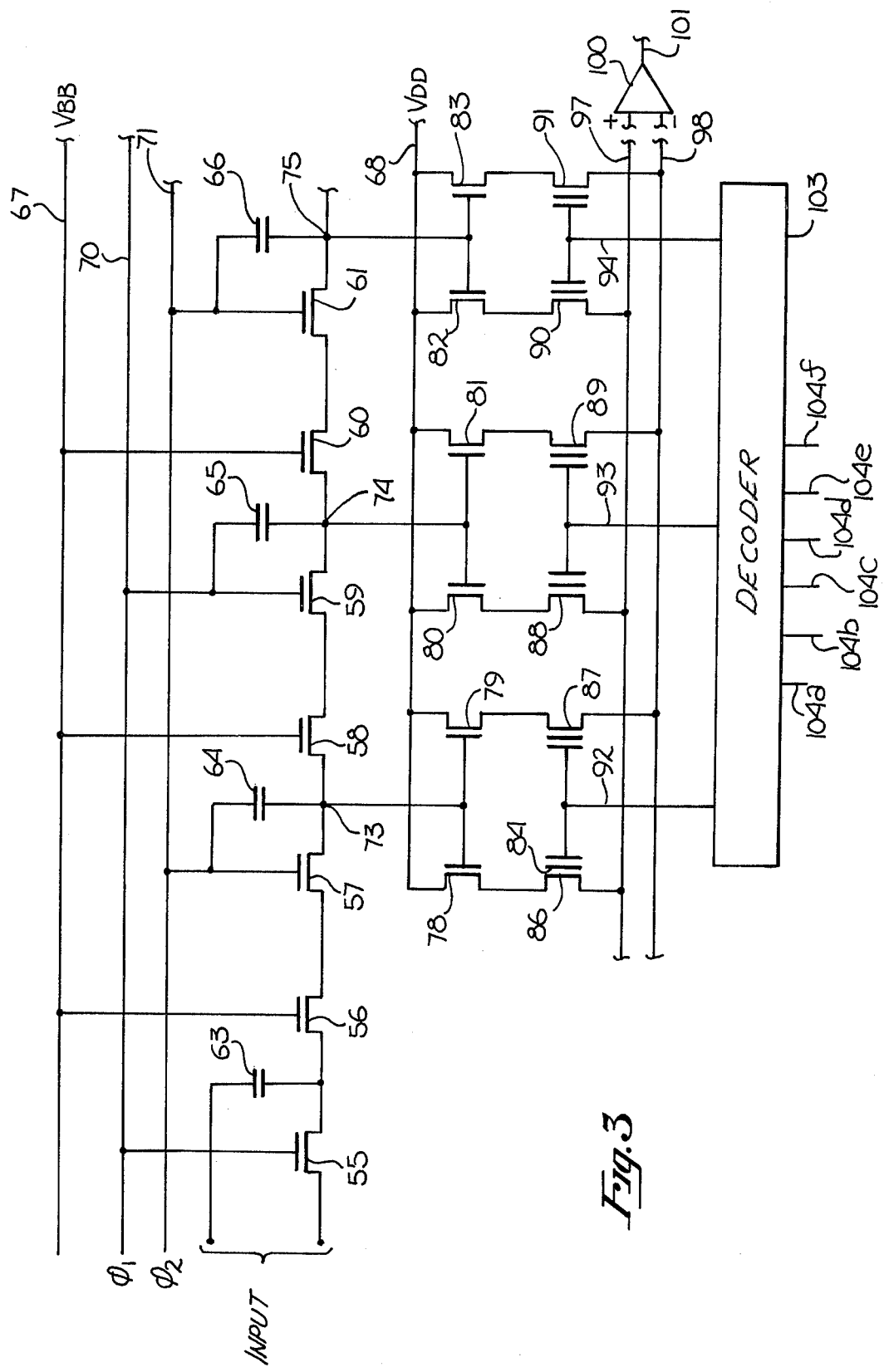
FIG. 3 is a circuit diagram illustrating a portion of the presently preferred bucket-brigade charge transfer means, the readout transistors coupled to taps along the bucket-brigade transfer means, the programmable devices used to select the various taps along the bucket-brigade transfer means and other circuitry.

Referring to FIG. 3, a portion of the presently preferred embodiment for a bucket-brigade charge transfer means is illustrated along with the readout transistors and programmable devices which allow the filter of FIG. 3 to be electrically programmed. The input signal to the filter, and in particular to the transfer means of FIG. 3, is applied to one terminal of capacitor 63 and to the drain terminal of an MOS field-effect transistor 55. The other terminal of capacitor 63 is coupled to the source terminal of transistor 55, and the drain terminal of transistor 56. Transistors 55, 56, 57, 58, 59, 60 and 61 are all coupled in series along the bucket-brigade transfer means.

The transistors 56, 58 and 60 are part of the transfer stages of the bucket-brigade; their gates are coupled to the source of a positive potential $V_{BB}$, line 67. These devices are employed to present surface potential modulation. The other part of the transfer stages (transistors 55, 57, 59 and 61) of the bucket-brigade have their gates alternately coupled to lines 70 and 71. Line 70 receives the $\phi_1$ timing signal, while line 71 receives the complementary $\phi_2$ timing signal. The signal on line 70 is coupled to the gates of transistors 55 and 59, while the signal on line 71 is coupled to the gates of transistors 57 and 61.

A holding stage is disposed between each transfer stage in the bucket-brigade, each of these stages comprises a bootstrap capacitor which is defined by a lightly doped n-type region in the substrate and a polycrystalline silicon gate-like member disposed above, and insulated from, the substrate. These bootstrap capacitors are shown as capacitors 63, 64, 65 and 66 in FIG. 3. The lightly doped n-type regions for capacitors 64 and 65 are shown as regions 109 and 112, respectively in FIG. 4.

The readout nodes or taps of the transfer means are shown as nodes or taps 73, 74 and 75. Tap 73 is coupled to the gate of transistor 57 through the bootstrap capacitor 64, similarly tap 74 is coupled to the gate of transistor 59 through the bootstrap capacitor 65, and tap 75 is coupled to the gate of transistor 61 through the bootstrap capacitor 66.

As will be appreciated, the transfer means may be of any desired length, and in the presently preferred embodiment 64 taps are employed. The input signal, applied to the input terminals of the transfer means, will be moved along the transfer means in the form of charge in an ordinary manner, and at a rate determined by the timing signals applied to lines 70 and 71. In the presently preferred embodiment, as mentioned, holding stages are employed in the transfer means. These stages, in addition to providing other advantages, eliminate the stringent waveform requirements for the timing signals applied to lines 70 and 71 associated with some prior art bucket-brigade charge transfer means.

Non-destructive readout from the bucket-brigade charge transfer means is accomplished from each tap through a pair of field-effect transistors which have their gates coupled to such taps. Specifically, tap 73 is coupled to the gates of field-effect transistors 78 and 79, tap 74 is coupled to the gates of transistors 80 and 81, tap 75 is coupled to the gates of transistors 82 and 83. The drain terminals of transistors 78, 79, 80, 81, 82 and 83 are coupled to a source of positive potential $V_{DD}$, line 68. These readout transistors couple the taps (through the programmable devices) to a readout or output line such as lines 97 and 98. The signal on these lines is substantially equal to the sum of the signals sensed at all of the taps connected to a given readout or output line. The source terminals of each of these readout transistors is coupled to one terminal of a programmable floating gate device; for example, the source terminal of transistor 78 is coupled to one terminal of device 86, and, in a similar manner, the transistors 79, 80, 81, 82 and 83 are coupled to one terminal of devices 87, 88, 89, 90 and 91, respectively. The other terminal of device 86 is coupled to the readout line 97, while the other terminal of device 87 is coupled to a readout line 98. Similarly, the other terminals of devices 87 and 89 are coupled to readout line 97, while the other terminals of devices 89 and 90 are coupled to readout line 98. Each of the devices has its control gate coupled to a decoder 103. The control gates of devices 86 and 87 are coupled by line 92 to decoder 103, and, in a similar manner, the control gates of devices 88 and 89 are coupled by line 93 to decoder 103, and the control gates of devices 90 and 91 are coupled by line 94 to the decoder 103.

The decoder 103 receives address signals (during programming) on lines 104a through 104f, decodes these signals, and then provides a positive signal to the selected line such as line 92. In the presently preferred embodiment, where 64 programmable taps are employed, the decoder provides a signal to one of 64 lines, such as lines 92, 93 and 94, as a function of the address signal applied to lines 104a through 104f.

The programmable floating gate devices, such as devices 86, 87, 88, 89, 90 and 91 are known in the art, and have been utilized as binary storage cells in read-only memories. Each of these devices are disposed on the substrate which includes the transfer means, readout transistors and decoder. However, these devices are fabricated on a region of the substrate which is ion implanted; these ion implanted regions form the host material for the programmable devices. In the presently preferred embodiment, a p-type substrate is utilized, and the host regions for the programmable devices are ion implanted (boron-implanted) to a dopant level of approximately 2 to 5 $\times$ $10^{16}$ atoms per cubic centimeter. This dopant level is an order of magnitude higher than the bulk of the p-type substrate.

Each programmable device includes a pair of spaced-apart n-type regions which define terminals of the device. A floating gate which in the presently preferred embodiment comprises an n-type polycrystalline silicon, is disposed above, and separated from, the channel formed between these n-type regions by a thermally grown oxide. One of such floating gates, gate 84, is illustrated in conjunction with device 86. Disposed above each floating gate is a second gate, or control gate, such as the gate associated with device 86 which is coupled to line 92. Again, in the presently preferred embodiment, the second gate or control gate comprises an n-type polycrystalline silicon.

The programmable devices may be used in two distinct manners in the filter. First they may be used as switches, that is, they are either on or off. For this binary use the floating gate is either fully charged or not charged. These devices may also be programmed in the analog sense. That is, they each may be programmed to pass a predetermined amount of signal. For this second mode of operation each tap may thus be "weighted".

The programmable devices when programmed for binary operation exhibit a shift in threshold of approximately 8 to 10 volts when a full charge exists on the floating gate. For the disclosed n-channel devices, the threshold becomes higher (more positive) when full charge exists on the floating gate. For purposes of explanation, assume that a charge is to be placed on the charge on the floating gate, a voltage of approximate 40 volts is applied to the control gate via line 92. This voltage is preferably applied in the form of a pulse or pulse train (e.g. 10 millisec.pulses). Simultaneously, a voltage of approximately 20 volts is applied to line 97, while the other terminal of device 89 is coupled to ground through transistor 78. Thus, during programming as will be described in more detail, line 68 and the substrate are held at ground potential and transistor 78 conducts. When these conditions are met within device 86, a large depletion region exists beneath the inversion layer defining the n-channel between the spaced-apart n-type regions. Hot electrons from this depletion region are injected into the floating gate 84 and remain on the floating gate since this gate is completely surrounded by oxide. The charge on the floating gate may be neutralized by subjecting the device to ultraviolet radiation or devices which may be electrically erased may be employed. A window is provided in the package containing the filter to allow the filter to be subjected to ultraviolet radiation, thereby permitting reprogramming.

To program these floating gate devices at some predetermined point between on and off, shorter pulses may be used (e.g. 10 microsec. pulses). Pulses are applied until the desired conduction through the device is reached. Also lower voltage may be used (30 volts on line 92 and 15 volts on line 97) with 10 millisec. pulses.

The output lines 97 and 98 are coupled to the input terminals of a differential amplifier 100, the output of this amplifier is shown as line 101. In the presently preferred embodiment the amplifier 100 (and the amplifiers associated with the other transfer means) are disposed on separate chips.

Figure 4:
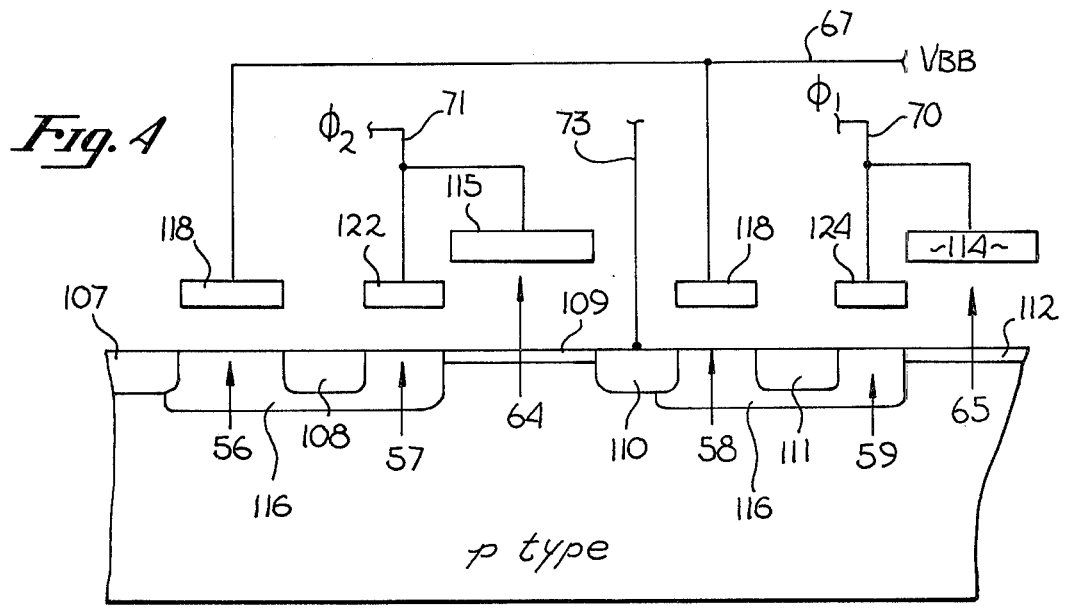
FIG. 4 is a cross-sectional, elevation view of a portion of the bucket-brigade charge transfer means of FIG. 3; this view is used to illustrate the two levels of polycrystalline silicon employed in the presently preferred embodiment.
Figure 5:
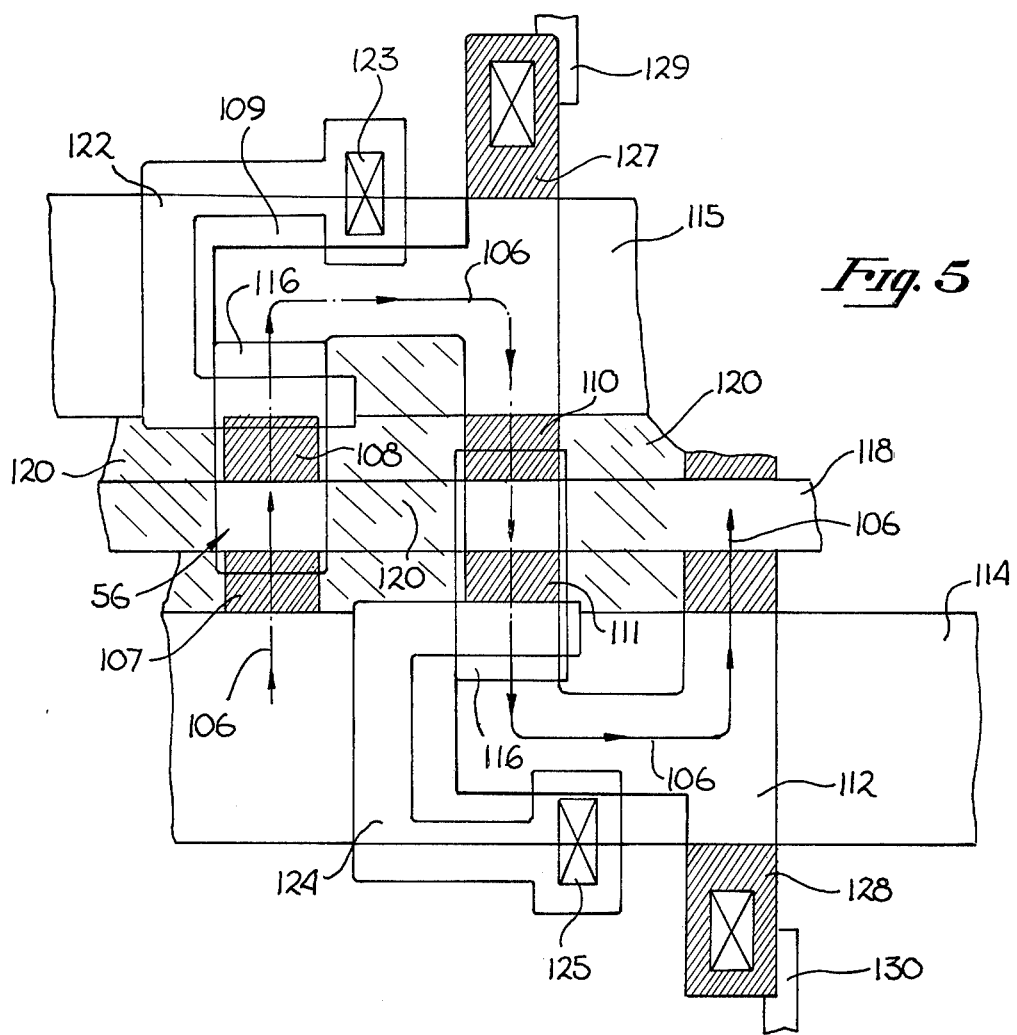
FIG. 5 is a plan view of a portion of the bucket-brigade charge transfer means of FIGS. 3 and 4 used to illustrate the manner in whih the bucket-brigade is arranged as an integrated circuit.

Referring to FIGS. 4 and 5, the layout of the bucket-brigade transfer means on the substrate is illustrated. In FIG. 4, a p-type substrate is illustrated which includes transistors 56, 57, 58 and 59, and capacitors 64 and 65 of FIG. 3. The transistor 56 includes two n-type regions 107 and 108 and a gate shown as layer 118. The gate of transistor 57 is shown as layer 122, while the gate of transistor 59 is shown as layer 124. The capacitor 64 includes a layer 115 disposed above the lightly doped n-type region 109, while capacitor 65 includes a layer 114 which is disposed above the lightly doped n-type region 112.

The substrate below gates 118, 122, and 124 is ion implanted with a p-type dopant (regions 116). Regions 116 form host regions for the regions 108 and 111 (FIG. 4). The regions 116 improve the charge transfer efficiency. (See "Performance Limitations of the IGFET Bucket-Brigade Shift Register" by Berglund and Boll, IEEE Transactions on Electronic Devices, Vol. ED-19, No. 7, July 1972.) This ion implantation may be performed simultaneously with the formation of the host regions for the floating gate devices. However, as best seen in FIG. 4 the substrate regions below layers 114 and 115 are not ion implanted, thus regions 109 and 112 are formed in the lower doped substrate. This provides an ideal holding stage in that the junction capacitance between region 109 and the substrate (and like junctions) is much smaller than the capacitor 64 (layer 115 and region 109).

In the presently preferred embodiment, layers 118, 122 and 124 are disposed at approximately the same first level above the substrate and are separated from the substrate by thermally grown oxide. Layers 114 and 115 define a second level disposed above the first level which is insulated from the first level by oxide. The first level layers comprising layers 118, 122 and 124, and the second level layers comprising layers 114 and 115 are n-type polycrystalline silicon. An aluminum interconnecting level is disposed above the second level and used to define interconnections and terminal pads.

In the fabrication of the filters, after the first level layers have been defined by ordinary masking steps, the substrate is subjected to an n-type dopant. When this occurs, regions 107, 108, 109, 110, 111 and 112 are formed; however, the extent of doping in this step is relatively light. After the second level polycrystalline layer has been fabricated (that is, layers 114 and 115), the substrate is again subjected to an n-type dopant which further defines the n-type regions 107, 108, 110 and 111. However, since the layers 114 and 115 aere disposed above regions 109 and 112, these regions do not receive the additional dopant, and thus remain more lightly doped than the other regions shown in FIG. 4.

In FIG. 5, the flow of charge in the bucket-brigade transfer means is illustrated by line 106. This charge flow is shown first entering region 107, then flowing into regions 108, 109, 110, 111 and 112. The layers 114 and 115 are elongated strips as shown in FIG. 4 and receive the timing signals coupled to lines 70 and 71. The first level layer 118 is an elongated strip disposed between, and parallel to, the spaced-apart strips forming layers 114 and 115. This layer is coupled to line 67 and receives the $V_{BB}$ potential. The gate of transistor 57 is a generally C-shaped gate layer 122 which is adjacent to (but above) the region 108. The charge after passing through region 108 under gate 122 then flows into region 109, this being the more lightly doped region. The well 123 allows a connection to be made between layer 122 and layer 115 in order to couple the gate of transistor 57 to the $\phi_2$ signal. The tap 73 illustrated in FIGS. 3 and 4 comprises a more heavily doped region 127 which is contiguous with the region 109. A finger 129 which defines the gates of transistors 78 and 79 of FIG. 3 is partially shown in FIG. 5; this finger is connected to region 127 through a well.

In a similar manner, transistor 59 includes a C-shaped gate layer 124 which is coupled to the layer 114 via well 125. Adjacent to region 112 is a more heavily doped region 128 which is connected to the partially illustrated finger 130. This finger defines the gates of transistors 80 and 81 of FIG. 3.

Ion implanted channel stops in the substrate are utilized to separate stages of the bucket-brigade; these stop regions are shown generally by the lined regions 120 in FIG. 5.

As previously mentioned, the bucket-brigade charge transfer means of FIG. 3 in one presently preferred (binary programmed) embodiment is implemented with 8 parallel transfer means, each having 64 taps on a single silicon chip with the amplifiers, such as amplifier 100, of FIG. 3, external to the chip. The output pads of the chip are connected to amplifiers, such as amplifier 100, with the output from each of the amplifiers, such as line 101 of FIG. 3, being coupled to a weighting resistors, such as resistors 42, 43, 44 and 45 of FIG. 2. The output of these resistors is summed and coupled to an amplifier, such as amplifier 47 of FIG. 2.

Assume now that the filter which includes the bucket-brigade transfer means illustrated in FIG. 3 is to be programmed with a correlating signal or other function. For binary programming, the correlating signal or function for this embodiment, is converted to sixty-four samples, each sample of which includes an eight bit digital word. Note that since amplifier 100 of FIG. 3 includes a positive input terminal and a negative input terminal, and since there are two programmable devices associated with each tap, each sample of the correlating signal or other function may include an eight bit "positive" word or an eight bit "negative" word.

To program the programmable devices such as devices 86 through 91, inclusive, of FIG. 3, line 68 is coupled to ground, and the bucket-brigade transfer means is operated by applying the complementary timing signals to lines 70 and 71. A strong positive signal is applied to the input of the transfer means. This, in turn, causes all the readout transistors to conduct, such as transistors 78 through 83, inclusive. The conduction of these readout transistors couples one terminal of each of the programmable devices to ground through line 68. Assume further that the binary bit which is to be stored within device 86 is a binary zero indicating that device 86 is not to conduct when the filter is in operation. As mentioned, to prevent device 86 from conducting, a charge (electrons) must be injected into the floating gate 84. In order to accomplish this, first an appropriate signal is applied to decoder 103, which signal will activate line 92 with a positive potential of approximately 40 volts. This potential preferably is in the form of a pulse train or single pulse, as opposed to a DC potential. Simultaneously with the application of a potential to line 92 a potential of approximately 20 volts is applied to line 97. With these potentials, hot electrons will be injected from the substrate into the floating gate 84. Obviously, if device 87 is to have its floating gate charged, line 98 would be coupled to the positive potential of approximately 20 volts. In a similar manner, each of the programmable devices in the filter may be programmed. With reference briefly to FIG. 2, the most significant bits associated with the sixty-four samples of the correlating signal are programmed into the filter which is coupled to the resistor having the least resistance, such as filter 39. The bits of the correlating signal representing the least significant bits would be programmed into the filter coupled to the resistor having the greatest resistance, such as filter 36.

If the correlating signal or other function is to be programmed into the filter in analog form, each device, such as devices 86 through 91 is programmed to provide the desired weighting, as described.

When the filter is used, positive potentials are applied to lines $V_{BB}$ and $V_{DD}$. The potential $V_{BB}$, line 67, is maintained at an equal or slightly lower potential than the peaks of the timing signals applied to lines 70 and 71. This facilitates transfer of charge from the holding stages of the bucket-brigade transfer means to the adjacent stages. While not illustrated, during operation, a potential of approximately five volts is applied to the control gates of all the programmable devices. For example, the potential of five volts is applied to lines 92, 93, 94, and all the other lines coupled to the control gates of the programmable devices. This potential is low enough to prevent inadvertent programming, or slow programming, of any of the programmable devices.

Once the correlating signal or other function has been programmed into the filter, an analog input signal may be applied to the input terminals of the bucket-brigade transfer means. This input signal is applied to all eight transfer means utilized in the binary programmed embodiment. Also, the appropriate timing signals are applied to lines 70 and 71, to cause the charge to be transferred along these bucket-brigade transfer means. The output signal from each of the differential amplifiers, such as amplifiers 100, is weighted with the circuit shown in FIG. 2 and summed on line 46 for the binary weighted embodiment. For the analog programmed embodiment, the output of amplifier 100, or the like, provides the correlated signal.

The filter in its presently preferred embodiment may be readily erased by subjecting the substrate to ultraviolet radiation, or electrically erasable devices may be employed. Thus, the filter may be re-programmed as many times as desired. As is apparent, the ability to reprogram the filter allows experimentation with a correlating signal or other program, and the determination of an optimum signal or function for a particular application. Once this correlating or other signal has been determined, a mask programmable or fusible link programmable filter may be desirable, particularly where large quantities are required for the binary programmed embodiment. By way of example, in a mask programmable embodiment each of the programmable devices would be replaced with either an open connection or closed connection. The same result could be achieved through known fusible link techniques.

While in FIG. 2 the digital weighting is performed with a plurality of resistors at the output of each filter, other weighting circuits may be used. For example, resistors may be used at the inputs to the filters, or amplifiers may be used at the inputs or outputs of the filters. Moreover, the weighting means may be fabricated on the "chip" or substrate which includes the filters. This may be accomplished by capacitance weighting, which weighting would be performed by the first bucket of each transfer means. For example, the bucket associated with transistor 55 and capacitor 63 of FIG. 3 may be fabricated to accept, more (or less) of the input signal when compared to the first bucket of other transfer means. A combination of first bucket capacitance weighting and resistor weighting may be used. Since only one bucket of each transfer means requires capacitance weighting, the prior art problems associated with the capacitance weighting of each bucket in a transfer means are not encountered.

The filter of FIG. 3 may also be employed as a recursive filter, as shown by the two-pole recursive filter of FIG. 6. The recursive filter of FIG. 6 includes a bucket-brigade charge transfer means 132 which may be the same as the transfer means of FIG. 3. The read-out taps of transfer means 132 are coupled to a programming means 134 by a plurality of lines 133. These taps correspond to the taps 73, 74 and 75 of FIG. 3.

The programming means 134 may be identical to the programming means employed with the apparatus of FIG. 3 which includes the floating gate devices and the read-out transistors, such as device 86 and transistor 78. The programming means selectively couples taps in the transfer means to lines 138 and 139. These lines correspond to lines 97 and 98 of FIG. 3. For purpose of explanation lines 136 and 137 are shown coupling the programming means to lines 138 and 139, respectively. Lines 136 and 137 are used to graphically illustrate the programming means 134 has been programmed such that two spaced-apart taps along transfer means 134 are coupled to lines 138 and 139. The other lines which are coupled to non-conducting floating gate devices are not shown in FIG. 6.

The delayed signal on line 138 is coupled to node 158 and the delayed signal on line 139 is coupled to node 155. Node 158 is coupled to the input 163 of amplifier 161 through resistor 157 and to the input of amplifier 143 through resistor 159. Similarly node 155 is coupled to the input of amplifier 161 via resistor 154 and to the input of amplifier 143 through resistor 156. The output of amplifier 161 (node 162) which includes the X(t) signal is coupled to the input of transfer means 132 and to the input of amplifier 143 via resistor 160.

The signal on line 136 is delayed by a predetermined period $t_1$, by the transfer means 132. Similarly the signal present on line 137 is delayed by a predetermined period $t_2$. The length of these delay periods may be controlled by the timing signals $\phi_1$ and $\phi_2$ and by the tap selection. By selection of $t_1$ and $t_2$ and the resistors of FIG. 6, each filter may thus be employed as a recursive filter. For a discussion of a related recursive filter employing a variable clock signal see "Programmable Bandpass Filter and Tone Generator Using Bucket-Brigade Delay Lines", by Smith, Bulter & Puckette, *IEEE Transactions on Circuits and Systems,* July 1974.

In FIG. 7 a bucket-brigade charge transfer means 146, which may be similar to the above described transfer means is shown. The taps of this transfer means are coupled to transistors, such as transistors 147, 148 and 149 for non-destructive reading on lines 138a and 139a, in the same manner that transistors 25a, 25b, etc. are coupled to transfer means 18 of FIG. 1.

The gates of transistors 148 and 149, and the like gates, are coupled to decoder 151 such that the decoder 151 may selectively couple the read-out taps of transfer means 146 to line 139a. Similarly the gates of transistor 147, and the like gates, are coupled to decoder 150 such that the decoder 150 may selectively couple the read-out taps of transfer means 146 to line 138a. The decoders 150 and 151 may be an ordinary decoders for decoding digital signals sensed on lines 152 and 153, respectively and for then activating the selected transistor, such as transistors 147, 148 or 149.

The apparatus of FIG. 7 may replace that portion of the circuitry shown within dotted line 164 of FIG. 6. Note lines 138a and 139b of FIG. 7 would be coupled to lines 138 and 139, respectively of FIG. 6, and line 162a of FIG. 7 would be coupled to node 162 of FIG. 6. By the application of appropriate signals to lines 152 and 153 a time varying recursive filter is obtained.

Thus, a semiconductor filter has been disclosed which may be substantially fabricated on a single substrate or chip employing known MOS technology. The filter which may be employed as a transversal or recursive filter, may be electrically programmed with binary or analog signal, and re-programmed. The filter does not exhibit many of the problems associated with the prior art semiconductor filters.

I claim:

1. In a semiconductor filter which includes a charge transfer means for transferring an input signal, said transfer means including a plurality of nodes for sensing charge in said transfer means, an improvement for selectively coupling said nodes comprising:
    a plurality of electrically programmable MOS devices each of which includes a pair of spaced apart regions disposed in a substrate and a floating gate insulation from, and disposed above, said substrate, each of said floating gates being completely surrounded by oxide, each of said devices being coupled to one of said nodes;
    whereby a connection, or open connection, may be made to nodes in said transfer means by selectively injecting charge onto said floating gates thereby permitting programming of said filter.

2. The improvement defined by claim 1 wherein said pair of spaced apart regions of each of said MOS devices are n-type regions.

3. The improvement defined by claim 2 wherein each of said floating gates comprise polycrystalline silicon.

4. In a semiconductor filter employing at least one bucket-brigade transfer means, said transfer means having a plurality of taps, an improvement for non-destructively, and selectively, sensing signals at said taps comprising:
    a plurality of readout field-effect transistors, each including a gate coupled to a different one of said taps;
    a first readout line; and
    a plurality of electrically programmable MOS floating gate devices coupling each of said readout transistors to said first readout line, each of said floating gate devices including a floating gate completely surrounded by oxide;
    whereby said MOS floating gate devices may be selectively programmed thereby coupling predetermined taps to said first readout line.

5. The improvement defined by claim 4 including a second readout line coupled to said taps through a plurality of electrically programmable MOS floating gate devices such that each tap may be selectively coupled to said first and said second readout lines.

6. The improvement defined by claim 5 wherein said first and said second readout lines are coupled to input terminal of a differential amplifier.

7. The improvement defined by claim 6 wherein each of said floating gate devices are n-channel devices employing a polycrystalline silicon floating gate.

8. The improvement defined by claim 7 wherein each of said floating gate devices employs two layers of polycrystalline silicon; one of said layers defining said floating gate, the other of said layers defining a control gate.

9. A semiconductor filter comprising:
    a plurality of bucket-brigade transfer means disposed on a silicon substrate;
    a plurality of field-effect transistors disposed on said substrate and coupled to said transfer means for sensing charge in said transfer means;
    a plurality of readout lines, disposed on said substrate; and,
    a plurality of electrically programmable floating gate devices, each of said devices coupling one of said transistors to one of said readout lines, said devices being disposed on said substrate and each of said devices including a floating gate completely surrounded by oxide;

whereby said floating gate devices may be electrically programmed with a predetermined function and the filtered signal sensed on said readout lines.

10. The filter defined by claim 9 including weighting means for weighting signals coupled to said readout lines.

11. The filter defined by claim 10 wherein said weighting means comprises capacitance weighting means defined by the first bucket of each of said bucket-brigade transfer means.

12. The filter defined by claim 9 wherein said substrate comprises a p-type substrate and wherein said transistors and devices comprise n-channel means.

13. A semiconductor filter comprising:

an MOS bucket-brigade charge transfer means, for receiving an input signal and for transferring charge representative of said input signal, said transfer means including a plurality of tap means for sensing charge in said transfer means, at least one line; and a plurality of MOS electrically programmable floating devices each device including a pair of spaced-apart regions and a floating gate completely surrounded by oxide, for storing charge, each of said devices being coupled between one of said tap means and said line;

whereby said floating gate devices may be selectively programmed permitting predetermined coupling between said tap means and said line, thereby permitting filtering of said input signal.

* * * * *